US011270951B2

(12) United States Patent
Tang et al.

(10) Patent No.: US 11,270,951 B2
(45) Date of Patent: Mar. 8, 2022

(54) SUBSTRATE COMPRISING AT LEAST ONE PATTERNED GROUND PLANE FOR SHIELDING

(71) Applicant: QUALCOMM Incorporated, San Diego, CA (US)

(72) Inventors: Rui Tang, San Diego, CA (US); Zhongning Liu, San Diego, CA (US); Chenqian Gan, Shanghai (CN)

(73) Assignee: QUALCOMM Incorporated, San Diego, CA (US)

( * ) Notice: Subject to any disclaimer, the term of this patent is extended or adjusted under 35 U.S.C. 154(b) by 26 days.

(21) Appl. No.: 16/219,071

(22) Filed: Dec. 13, 2018

(65) Prior Publication Data
US 2020/0194378 A1 Jun. 18, 2020

(51) Int. Cl.
*H01L 23/552* (2006.01)
*H01L 23/64* (2006.01)
*H01L 49/02* (2006.01)
*H05K 9/00* (2006.01)

(52) U.S. Cl.
CPC .......... *H01L 23/552* (2013.01); *H01L 23/645* (2013.01); *H01L 28/10* (2013.01); *H05K 9/0064* (2013.01); *H05K 9/0081* (2013.01)

(58) Field of Classification Search
CPC ..... H01L 23/645; H01L 23/552; H01L 28/10; H05K 9/0064; H05K 9/0081
See application file for complete search history.

(56) References Cited

U.S. PATENT DOCUMENTS

| 6,388,535 B1* | 5/2002 | Otsuki ................. H03B 5/1847 331/177 R |
| 6,501,363 B1* | 12/2002 | Hwu ................... H01F 27/2804 29/602.1 |
| 6,586,309 B1* | 7/2003 | Yeo ......................... H01L 24/48 438/381 |
| 7,236,080 B2* | 6/2007 | Kyriazidou ......... H01F 17/0006 257/E27.046 |
| 9,807,882 B1* | 10/2017 | Berdy ...................... H05K 3/06 |
| 2003/0030533 A1 | 2/2003 | Waffenschmidt |
| 2006/0170071 A1 | 8/2006 | Imaoka et al. |

(Continued)

FOREIGN PATENT DOCUMENTS

EP 0880309 A2 11/1998

OTHER PUBLICATIONS

International Search Report and Written Opinion—PCT/US2019/060377—ISA/EPO—dated May 6, 2020.

*Primary Examiner* — Eugene Lee
(74) *Attorney, Agent, or Firm* — Loza & Loza, LLP

(57) ABSTRACT

A substrate that includes at least one dielectric layer, a first inductor formed in the at least one dielectric layer, a second inductor formed in the at least one dielectric layer, and a patterned ground layer formed on a metal layer of the substrate. The patterned ground layer is configured to provide electromagnetic (EM) shielding. The patterned ground layer includes a plurality of slots. The plurality of slots may be filled with the at least one dielectric layer. The plurality of slots may include a slot with a rectangular shape, a slot with a polygon shape, a slot with a circular shape, or combinations thereof. The patterned ground layer may include at least one slot that, individually or collectively, has a shape of a spiral.

25 Claims, 14 Drawing Sheets

(56) References Cited

U.S. PATENT DOCUMENTS

| | | | |
|---|---|---|---|
| 2006/0176130 A1* | 8/2006 | Green | H01P 1/205 333/219 |
| 2006/0226510 A1* | 10/2006 | Goren | H01L 23/5223 257/531 |
| 2009/0212402 A1* | 8/2009 | Nakas | H05K 1/0224 257/659 |
| 2009/0243756 A1* | 10/2009 | Stevenson | A61N 1/3754 333/172 |
| 2010/0193904 A1* | 8/2010 | Watt | H01L 28/10 257/531 |
| 2013/0093451 A1* | 4/2013 | Cho | H01L 22/34 324/756.01 |
| 2013/0154773 A1* | 6/2013 | Siprak | H01P 3/082 333/238 |
| 2013/0250528 A1 | 9/2013 | Horibe | |
| 2017/0170569 A1* | 6/2017 | Elad | H01Q 13/00 |
| 2017/0215281 A1* | 7/2017 | Fritz | H05K 1/024 |
| 2019/0245275 A1* | 8/2019 | Hayashi | H01Q 1/52 |
| 2020/0027908 A1* | 1/2020 | Paul | H01L 27/13 |

\* cited by examiner

SUBSTRATE COMPRISING AT LEAST ONE PATTERNED GROUND PLANE FOR SHIELDING

BACKGROUND

Field

Various features relate to substrates, but more specifically to substrates that include at least one patterned ground plane for shielding.

Background

FIG. 1 illustrates an integrated device 100 that includes a substrate 102 and a die 104. The die 104 is coupled to the substrate 102 through a plurality of solder interconnects 140. The substrate 102 includes a plurality of dielectric layers 120 and a plurality of interconnects 122. Each layer of the dielectric layers 120 includes a patterned metal layer and vias. The substrate 102 includes a first solder resist layer 124, a second solder resist layer 126, and a plurality of solder interconnects 130. The substrate 102 may include several passive devices, such as inductors, that are embedded in the substrate 102. These passive devices may be defined by the plurality of interconnects 122 that are formed in the dielectric layers 120. These passive devices may be located near each other in the substrate 102, which can cause the passive devices to interfere with one another, resulting in passive devices having lower inductances and Q factors.

Therefore, there is a need for providing a substrate that can isolate and/or shield passive devices that are near each other. Ideally, such a substrate can isolate and/or shield passive devices from nearby passive devices while also minimizing the reduction in inductances of the passive devices.

SUMMARY

Various features relate to substrates, but more specifically to substrates that include at least one patterned ground plane for shielding.

One example provides a substrate having at least one dielectric layer, a first inductor formed in the at least one dielectric layer, a second inductor formed in the at least one dielectric layer, and a patterned ground layer formed on a metal layer of the substrate. The patterned ground layer is configured to provide electromagnetic (EM) shielding.

Another example provides a substrate having at least one dielectric layer, means for first inductance formed in the at least one dielectric layer, means for second inductance formed in the at least one dielectric layer, and means for electromagnetic (EM) shielding formed on a metal layer of the substrate.

Another example provides a method for fabricating a substrate. The method forms at least one dielectric layer. The method forms a first inductor in the at least one dielectric layer. The method forms a second inductor in the at least one dielectric layer. The method forms a patterned ground layer on a metal layer of the substrate. The patterned ground layer is configured to provide electromagnetic (EM) shielding.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate that includes at least one dielectric layer, a first inductor formed in the at least one dielectric layer, a second inductor formed in the at least one dielectric layer, and a patterned ground layer formed on a metal layer of the substrate. The patterned ground layer is configured to provide electromagnetic (EM) shielding. The first inductor may be an embedded inductor defined by one or more first interconnects. The second inductor may be an embedded inductor defined by one or more second interconnects. The patterned ground layer includes a plurality of slots. The plurality of slots may be filled with the at least one dielectric layer. The plurality of slots may include a slot with a rectangular shape, a slot with a polygon shape, a slot with a circular shape, or combinations thereof. The patterned ground layer may include at least one slot that, individually or collectively, has a shape of a spiral. In some implementations, the substrate that includes the patterned ground layer, is part of a device (e.g., integrated device) that includes a die. The substrate may be implemented in a radio frequency front end (RFFE) device.

Exemplary Substrate Comprising Patterned Ground Layer for Shielding

Figure 1:
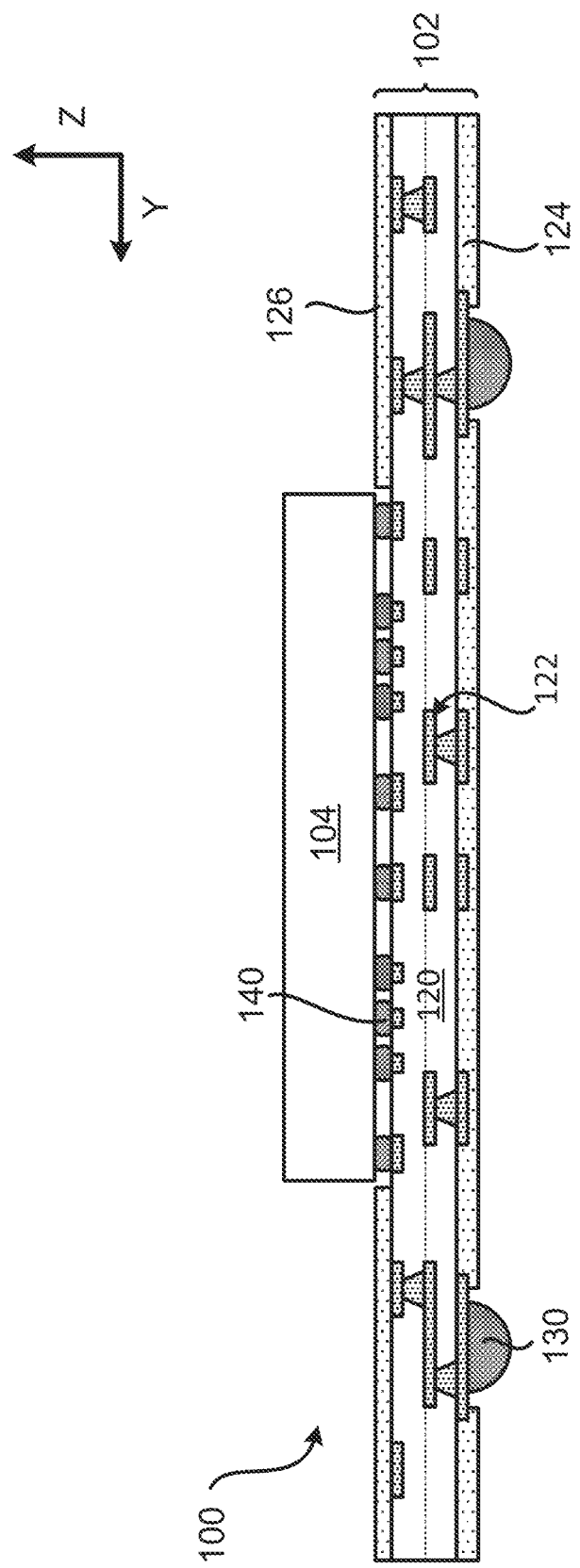
FIG. 1 illustrates a profile view of a device that includes a die and a substrate.
Figure 2:
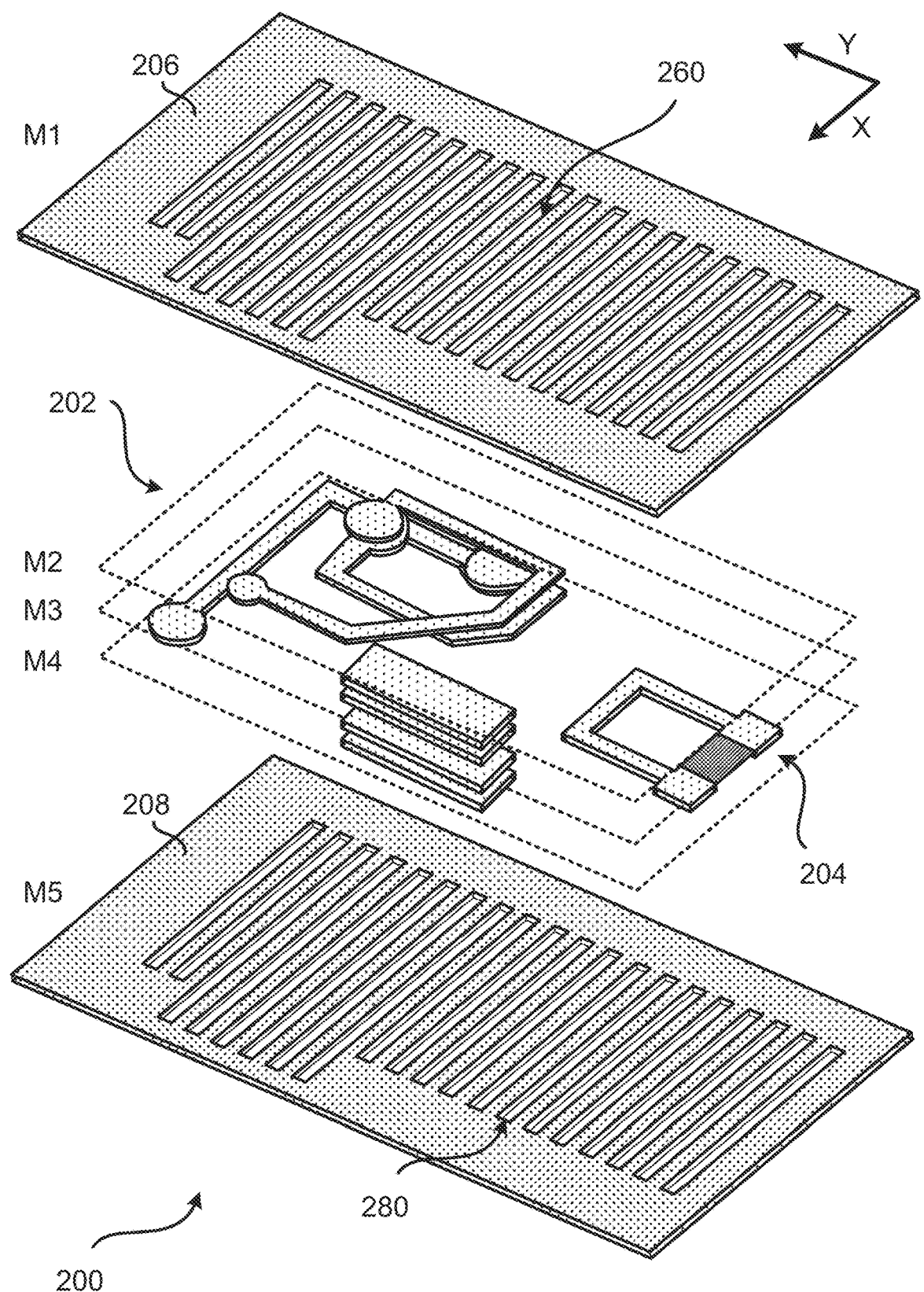
FIG. 2 illustrates an assembly view of a substrate that includes inductors and patterned ground layers for shielding the inductors.

FIG. 2 illustrates an assembly view of a substrate 200 that includes a first inductor 202, a second inductor 204, a first patterned ground layer 206, and a second patterned ground layer 208. The substrate 200 may include dielectric layer(s). The first inductor 202 may be defined by one or more first interconnects in the substrate 200. The second inductor 204 may be defined by one or more second interconnects in the substrate 200. The first inductor 202 and the second inductor 204 are located between the first patterned ground layer 206 and the second patterned ground layer 208. The first patterned ground layer 206 is formed on a metal layer (M1) (e.g., top metal layer) of the substrate 200, and the second patterned ground layer 208 is formed on another metal layer (M5) (e.g., bottom metal layer) of the substrate 200. However, different implementations may have a substrate 200 that includes patterned ground layer(s) on different metal layers.

The first patterned ground layer 206 and the second patterned ground layer 208 may each be coupled to ground. The first patterned ground layer 206 and the second patterned ground layer 208 may include an electrically conductive material, such as a metal (e.g., copper). The first patterned ground layer 206 and the second patterned ground layer 208 may, individually or collectively, provide shielding (e.g., electromagnetic (EM) shielding) and isolation for the first inductor 202 and the second inductor 204. The first patterned ground layer 206 and/or the second patterned ground layer 208 may be designed to reduce and/or minimize eddy currents generated by nearby EM devices and/or inductors. This in turn can help the first inductor 202 and/or the second inductor 204 perform with better inductance and higher Q factors. The first patterned ground layer 206 and/or the second patterned ground layer 208 may also help isolate the first inductor 202 from the second inductor 204, and vice versa.

The first patterned ground layer 206 may be a means for first EM shielding, and the second patterned ground layer 208 may be a means for second EM shielding. The first patterned ground layer 206 is shown as being on a top metal layer (e.g., M1) of the substrate and the second patterned ground layer 208 is on a bottom metal layer (e.g., M5) of the substrate. However, the first patterned ground layer 206 may be on a bottom metal layer of the substrate and the second patterned ground layer 208 may be on a top metal layer of the substrate.

The first patterned ground layer 206 includes a plurality of slots 260 and the second patterned ground layer 208 includes a plurality of slots 280. The plurality of slots 260 and the plurality of slots 280 may each have slots with different sizes (e.g., length, width) and shapes. The plurality of slots 260 and 280 may operate as de-gassing openings. The first patterned ground layer 206 and/or the second patterned ground layer 208 may be configured to operate as a Faraday cage, to improve EM shielding.

The configuration, dimensions, design, size and/or shape of the patterned ground layers (e.g., 206, 208) may define how much shielding and/or isolation is provided for the first inductor 202 and the second inductor 204. Different implementations may provide patterned ground layer(s) with different configurations, dimensions, designs, size and/or shapes. These different configurations, dimensions, designs, size and/or shapes may affect the shielding and isolation performance of the patterned ground layers differently. Examples of different configurations, dimensions, designs, size and/or shapes for the patterned ground layers are further described below.

Similarly, the configuration, dimensions, design, size and/or shape of the first inductor 202 and the second inductor 204 are exemplary. Different implementations may use inductors with different configurations, dimensions, designs, sizes and/or shape.

Figure 3:
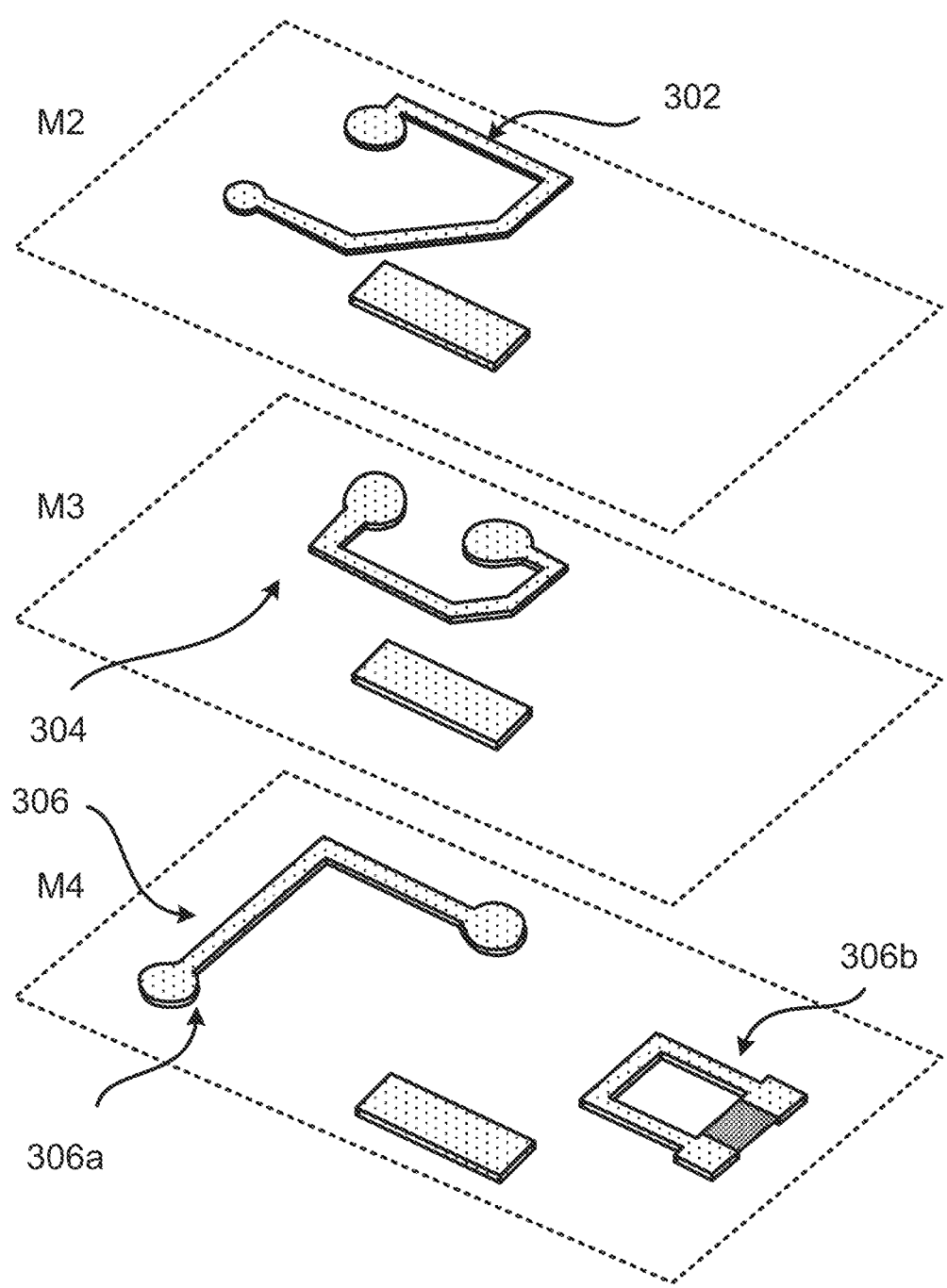
FIG. 3 illustrates an assembly view of inductors on several layers of a substrate.

FIG. 3 illustrates an assembly view of the first inductor 202 and the second inductor 204. The first inductor 202 may be an embedded inductor that is defined by a plurality of interconnects (e.g., first interconnects). For example, the first inductor 202 may be defined a plurality interconnects 302 on a metal layer M2, a plurality of interconnects 304 on a metal layer M3, and a plurality of interconnects 306a on a metal layer M4. The second inductor 204 may be an embedded inductor that is defined by the plurality of interconnects 306b formed on the metal layer M4. The plurality of interconnects 306a (e.g., first interconnects) and a plurality of interconnects 306b (e.g., second interconnects) may be part the plurality of interconnects 306 that are formed on the metal layer M4.

FIGS. 2-3 illustrate an example of inductor designs. However, different implementations may use different inductor designs and/or combinations. For example, different inductors may have different number of turns. Different inductors may be implemented on different numbers of metal layers. Different inductors may have different shapes and/or sizes. Different implementations may implement different numbers of inductors (e.g., 3 or more inductors). Thus, the inductor designs of FIGS. 2-3 are merely exemplary.

Although not shown, the metal layers that include the first patterned ground layer 206 and the second patterned ground layer 208 may also include interconnects (e.g., traces, pads) that are used to provide electrical connections (e.g., connections for data signal, power, ground). Similarly, metal layers between the first patterned ground layer 206 and the second patterned ground layer 208 may also include interconnects (e.g., traces, pads) that are used to provide electrical connections (e.g., connections for data signal, power, ground).

Figure 4:
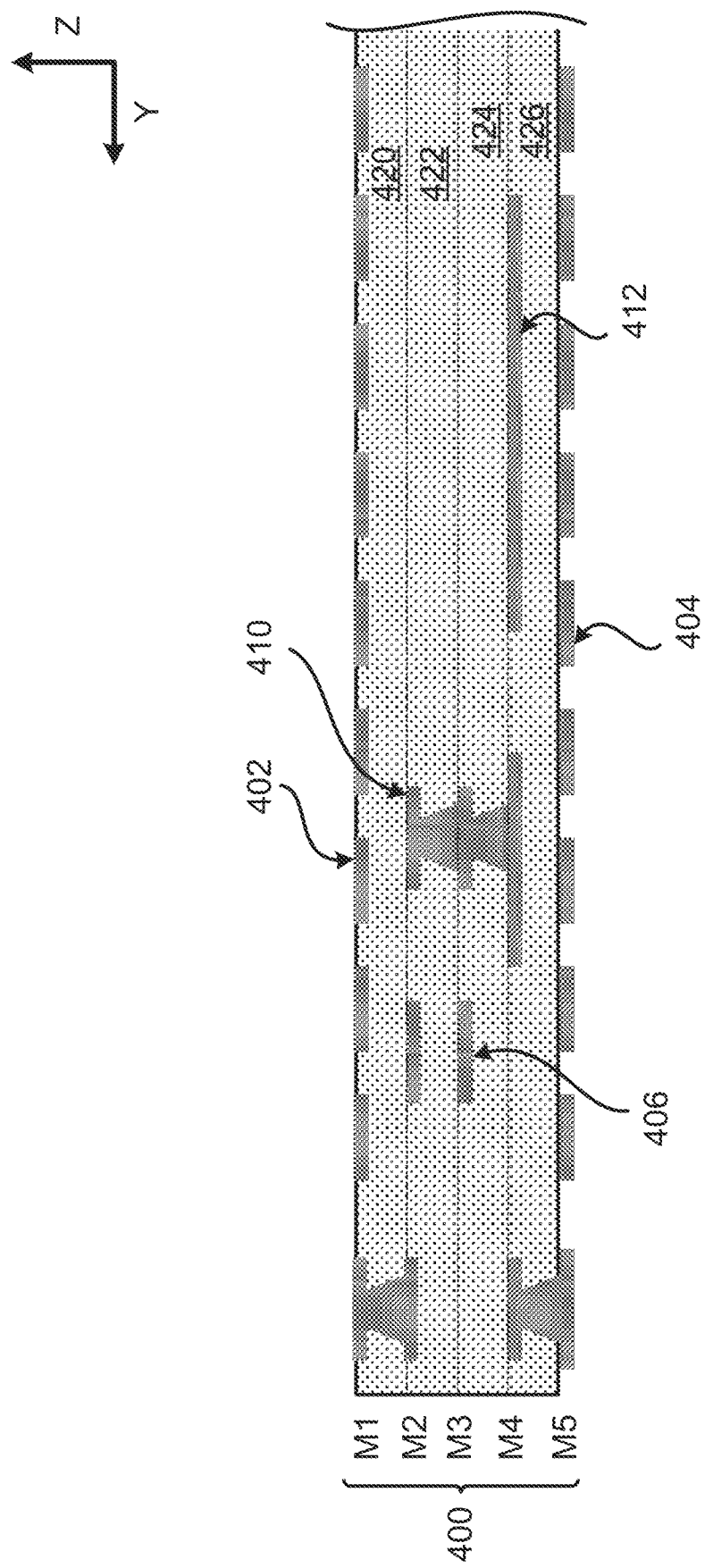
FIG. 4 illustrates a profile view of a substrate that includes inductors and patterned ground layers for shielding the inductors.

FIG. 4 illustrates exemplary profile view of a substrate 400 that includes patterned ground layers. The substrate 400 may be a representation of the substrate 200. The substrate 400 includes five metal layers (M1, M2, M3, M4, M5). The labeling of the metal layers of the substrate is exemplary. Different implementations may specify the metal layers differently. For example, the metal layers may be specified as M1, M2, M3, M4 and M5 from bottom to top. In some implementations, the M1 and M5 metal layers are considered as a top metal layer and a bottom metal layer, respectively, of the substrate. In some implementations, the M1 and M5 metal layers may be considered the first and last metal layers, respectively, of the substrate. In some implementations, the substrate 400 may include less than 5 metal layers or more than 5 metal layers (e.g., 6 or more metal layers).

FIG. 4 illustrates that the substrate 400 includes a dielectric layer 420, a dielectric layer 422, a dielectric layer 424 and a dielectric layer 426. In some implementations, the dielectric layer 420, the dielectric layer 422, the dielectric layer 424 and the dielectric layer 426 may be considered as one dielectric layer (e.g., single dielectric layer). The substrate 400 includes a plurality of interconnects 402, a plurality of interconnects 404 and a plurality of interconnects

406. The plurality of interconnects 406 may include the plurality of interconnects 410 and the plurality of interconnects 412.

The plurality of interconnects 402 may be formed on a metal layer (M1) (e.g., first metal layer, top metal layer) of the substrate 400. The plurality of interconnects 402 may define the first patterned ground layer 206. The plurality of interconnects 404 may be formed on a metal layer (M5) (e.g., last metal layer, bottom metal layer) of the substrate 400. The plurality of interconnects 404 may define the second patterned ground layer 208. It is noted that the positions of the first patterned ground layer 206 and the second patterned ground layer 208 are exemplary. Different implementations may form the first patterned ground layer 206 and the second patterned ground layer 208 on different metal layers of the substrate 400. Moreover, the substrate 400 may have different numbers of metal layers. In some implementations, there may only be one patterned ground layer, or more than two patterned ground layers.

The plurality of interconnects 410 may define the first inductor 202, and the plurality of interconnects 412 may define the second inductor 204. The first inductor 202 may be a means for second inductance, and the second inductor 204 may be a means for second inductance. The first inductor 202 and the second inductor 204 are located between the first patterned ground layer 206 and the second patterned ground layer 208. The configurations, shape, dimensions, positions and sizes of the first inductor 202 and the second inductor 204 are exemplary. In some implementations, the first inductor 202 and/or the second inductor 204 may be discrete inductors.

FIG. 4 illustrates that the substrate 400 is a coreless substrate. In some implementations, the substrate 400 may include a core layer. The core layer may include may include different dielectric materials, such a silicon, glass, quartz, epoxy, or combinations thereof.

FIG. 2 illustrates that the first patterned ground layer 206 and the second patterned ground layer 208 have approximately the same design. In some implementations, a substrate (e.g., 200, 400) may include ground layers with different designs and/or combinations.

Figure 6:
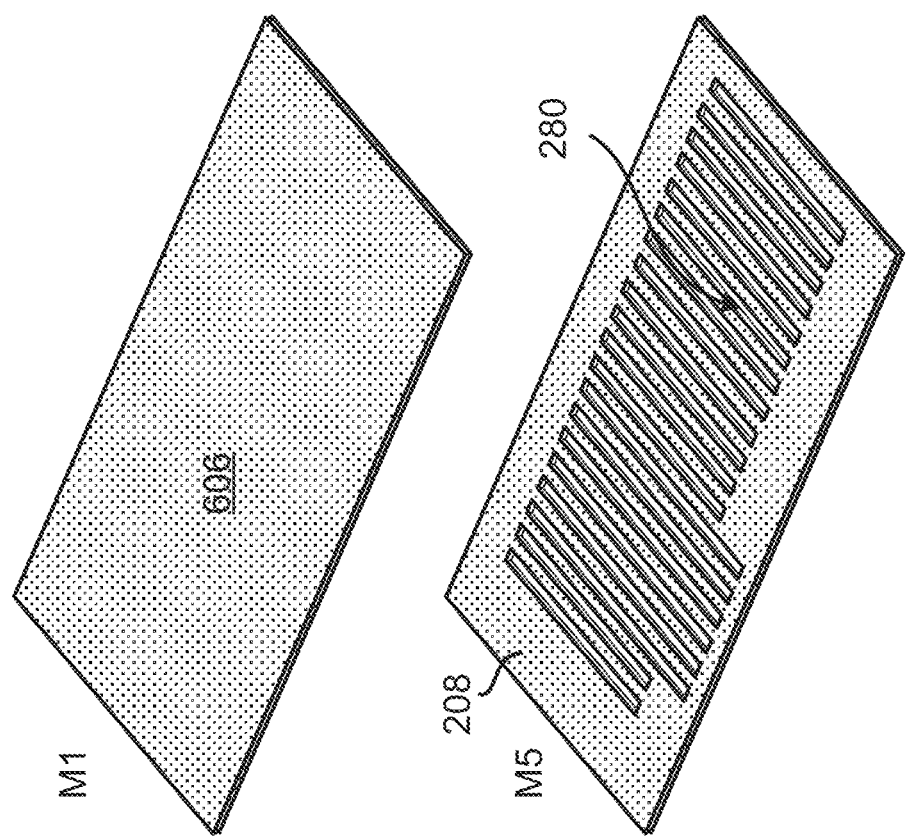
FIG. 6 illustrates an assembly view of two patterned ground layers for shielding.
Figure 5:
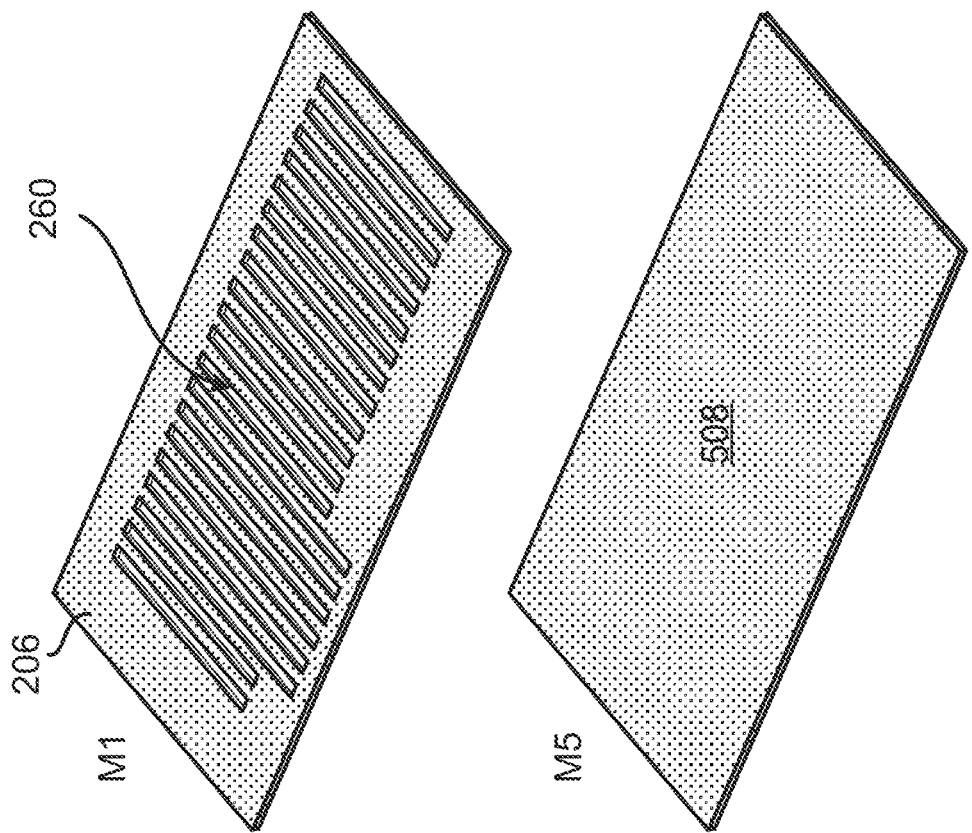
FIG. 5 illustrates an assembly view of two patterned ground layers for shielding.

FIG. 5 illustrates an assembly view of the first patterned ground layer 206 as a top ground layer for the substrate, and a second ground layer 508 as a bottom ground layer for the substrate. FIG. 6 illustrates an assembly view of a first ground layer 606 as atop ground layer for the substrate, and the second patterned ground layer 208 as the bottom ground layer for the substrate. These two combinations are exemplary of the different combinations of ground layers that may be implemented in a substrate. The positions of the metal layer (M1, M5) are exemplary, and the ground layers may be formed on any of the metal layers of the substrate.

Exemplary Patterned Ground Layers

FIGS. 7-12 provide examples of ground layers (e., patterned ground layers) that may be implemented in a substrate. The ground layers of FIGS. 7-12 may be implemented individually or in combinations with one another in a substrate. The ground layers of FIGS. 7-12 may replace or be used in combinations with other ground layers described in the disclosure. The ground layers of FIGS. 5-12 may be means for EM shielding.

Figure 7:
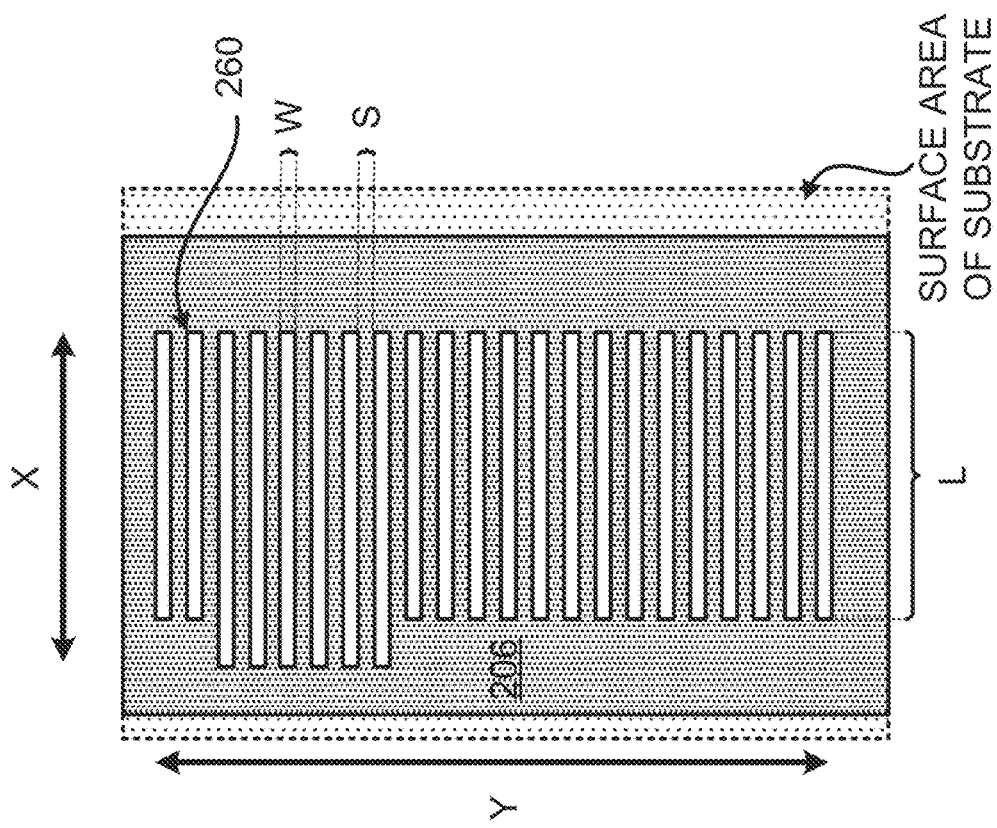
FIG. 7 illustrates a plan view of a patterned ground layer having slots with varying lengths.

FIG. 7 illustrates the first patterned ground layer 206 that includes a plurality of slots 260. Each slot has a respective width (W) and length (L). Each slot is separated by a spacing (S). FIG. 7 illustrates that the slots may have different lengths and/or widths. In some implementations, the length of the slots may be a maximum of 50% of the X dimension of the shielded structure (e.g., 50% of the X dimension of the inductor). In some implementations, the combined widths and spacing of the slots may be a maximum of 50% of the Y dimension of the shielded structures (e.g., 50% of the Y dimension of the inductors). In some implementations, the width of slot is a minimum of $\frac{1}{50}$ of the wavelength of the electromagnetic (EM) field that is generated by the inductor(s) (e.g., first inductor 202, second inductor 204). In some implementations, the spacing of slot is a minimum of $\frac{1}{50}$ of the wavelength of the EM field that is generated by the inductor(s) (e.g., first inductor 202, second inductor 204). Thus, the width and/or spacing of the slots may be approximately $\frac{1}{50}$ or greater of the wavelength (e.g., wavelength of the electromagnetic (EM) field that is generated by the inductor(s)). Therefore, in some implementations, the width and/or the spacing slots may be inversely proportional to the wavelength of the EM field that is generated by one or more inductors in the substrate.

The wavelength of the EM field that is generated is related to the frequency (e.g., operational frequency) of the current that flows and/or travels through the inductor(s). For example, wavelength times frequency may equal to the speed of EM field (wavelength*frequency=speed), where the speed may be the speed of the EM field when traveling through air or through a dielectric layer. The speed may be considered as a constant. Thus, a higher frequency results in a lower wavelength, while a lower frequency may result in a higher wavelength. Since the wavelength of the EM field is related to the frequency of the current, the width and/or spacing of the slots may also be related to the frequency of a current that travels through the inductors. When the width and/or spacing of a slot is related to a wavelength and/or a frequency, it may mean that the width and/or spacing is proportional or inversely proportional to the wavelength and/or the frequency.

In some implementations, a current that flows through one or more inductors (e.g., first inductor 202, second inductor 204) may have a frequency in a range of approximately 1-21 Gigahertz (Ghz). However, different implementations may use currents with different frequencies. The size (e.g., width, length, diameter) of each slot and spacing between neighboring slots may be designed based on the operational frequency of one or more inductor(s) located in the substrate, to optimize the shielding of the EM field to meet a minimum decibel (dB) of isolation. However, too much decibel (dB) isolation may not be good since it will reduce the inductance and/or Q factor of one or more inductors. Thus, a slot size may be configured based on the operational frequency (e.g., operational center frequency) of one or more inductors to provide a minimum decibel (dB) of isolation, while also minimizing the loss of inductance and/or Q factor of one or more inductors. In some implementations, the sizes, spacing, and/or shapes of the slots is configured to provide at least negative 60 decibel (dB) of isolation. The above factors and considerations may be applied to other designs of slots described in the present disclosure, such as the designs shown in FIGS. 8-12.

Figure 8:
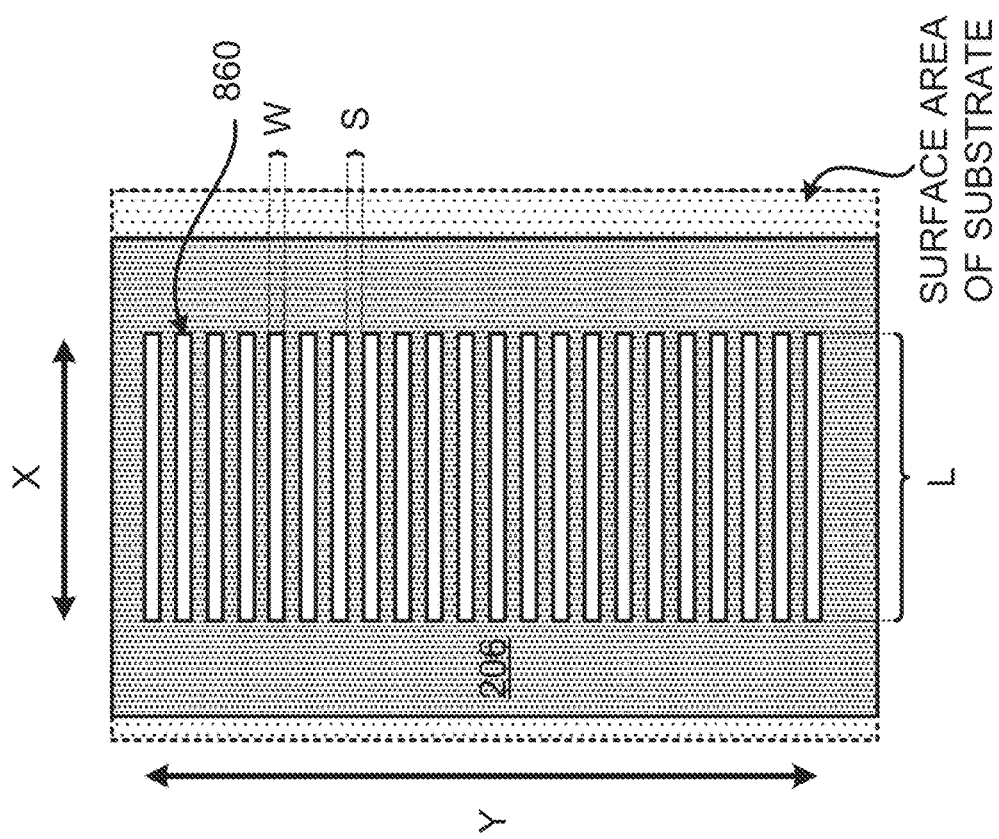
FIG. 8 illustrates a plan view of a patterned ground layer having slots.

FIG. 8 illustrates a patterned ground layer 806. The patterned ground layer 806 is similar to the first patterned ground layer 206 and/or the second patterned ground layer 208. The patterned ground layer 806 includes a plurality of slots 860. The plurality of slots 860 have uniform slots that have the same length, width and spacing.

FIGS. 2 and 5-8 illustrate that the length of the slots (e.g., 260, 280, 860) is aligned along the X direction. However, it is noted that the length of the slots may be aligned in the X direction, the Y direction, diagonally (e.g., 45 degrees), or combinations thereof. For example, some slots may be aligned in a first direction (e.g., X direction, Y direction, diagonally) and some slots may be aligned in a second direction (e.g., Y direction, X direction, diagonally).

Figure 9:
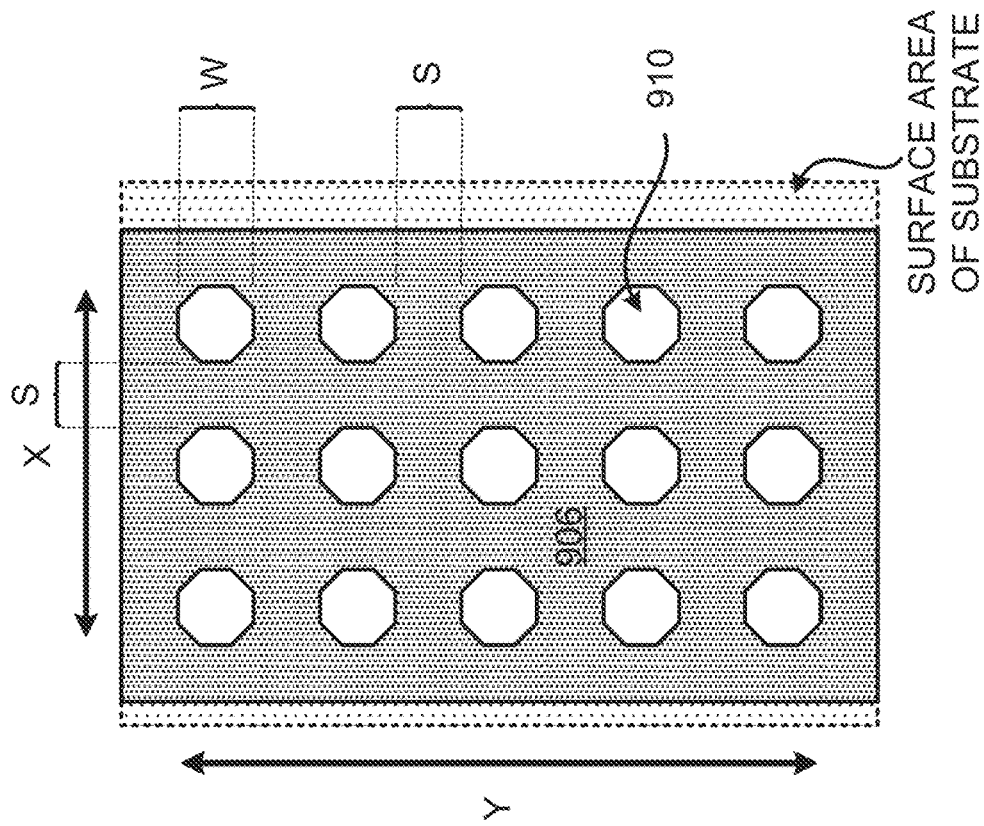
FIG. 9 illustrates a plan view of a patterned ground layer having slots with polygon shapes.

FIG. 9 illustrates a patterned ground layer 906 that includes a plurality of slots 910. The plurality of slots 910 have slots that have a polygon shape (e.g., octagon). Each slot has a respective diameter (D). In some implementations, the diameter of the slot may be referred as the width. Each slot is separated by a spacing (S). In some implementations, the combined lengths and spacings of the slots may be a maximum of 50% of the X dimension of the shielded structure (e.g., 50% of the X dimension of the inductor). In some implementations, the combined widths and spacing of the slots may be a maximum of 50% of the Y dimension of the shielded structures (e.g., 50% of the Y dimension of the inductors). In some implementations, the width of slot is a minimum of 1/50 of the wavelength. In some implementations, the spacing of slot is a minimum of 1/50 of the wavelength. Thus, the width and/or spacing of the slots may be approximately 1/50 or greater of the wavelength (e.g., wavelength of the electromagnetic (EM) field that is generated by the inductor(s)). An example of a width and/or spacing that is greater than 1/50 of a wavelength would be a width and/or spacing that is 1/40 of a wavelength.

Figure 10:
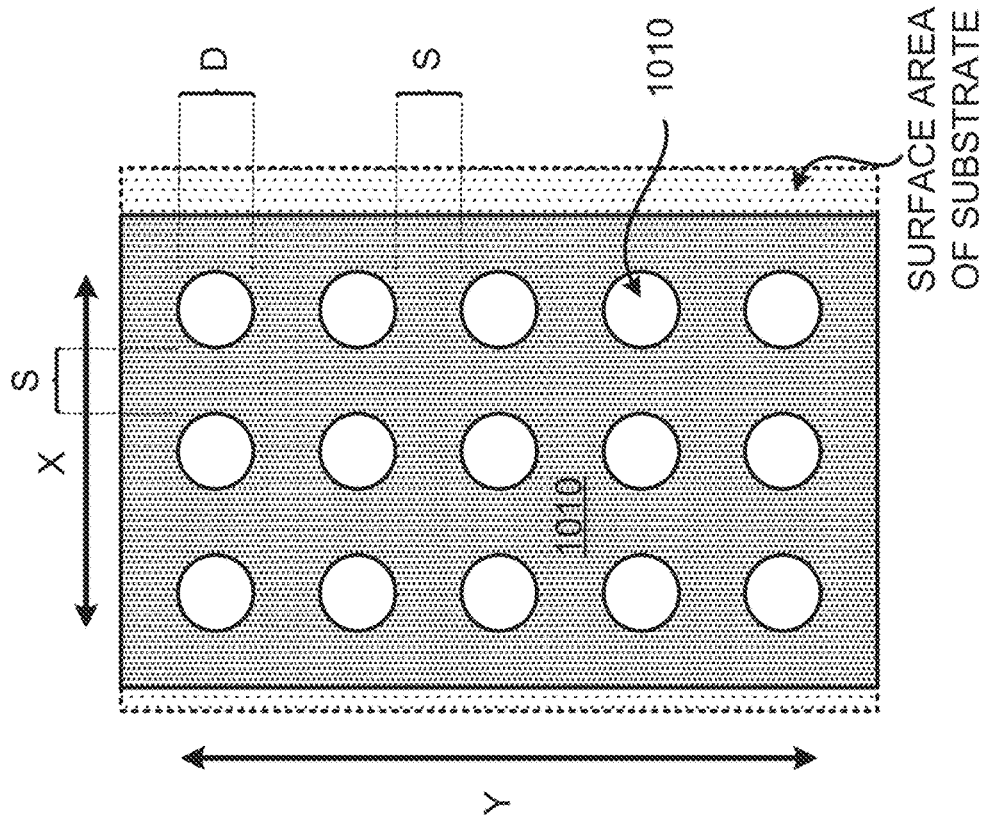
FIG. 10 illustrates a plan view of a patterned ground layer having slots with circular shapes.

FIG. 10 illustrates a patterned ground layer 1006 that includes a plurality of slots 1010. The plurality of slots 1010 have slots that have a circular shape. Each slot has a respective diameter (D). The dimensions described in FIG. 9 may apply to the plurality of slots 1010. For example, the minimum width described for the slots of FIGS. 7-8 may also refer to a minimum diameter of a slot of FIGS. 9-10.

Figure 11:
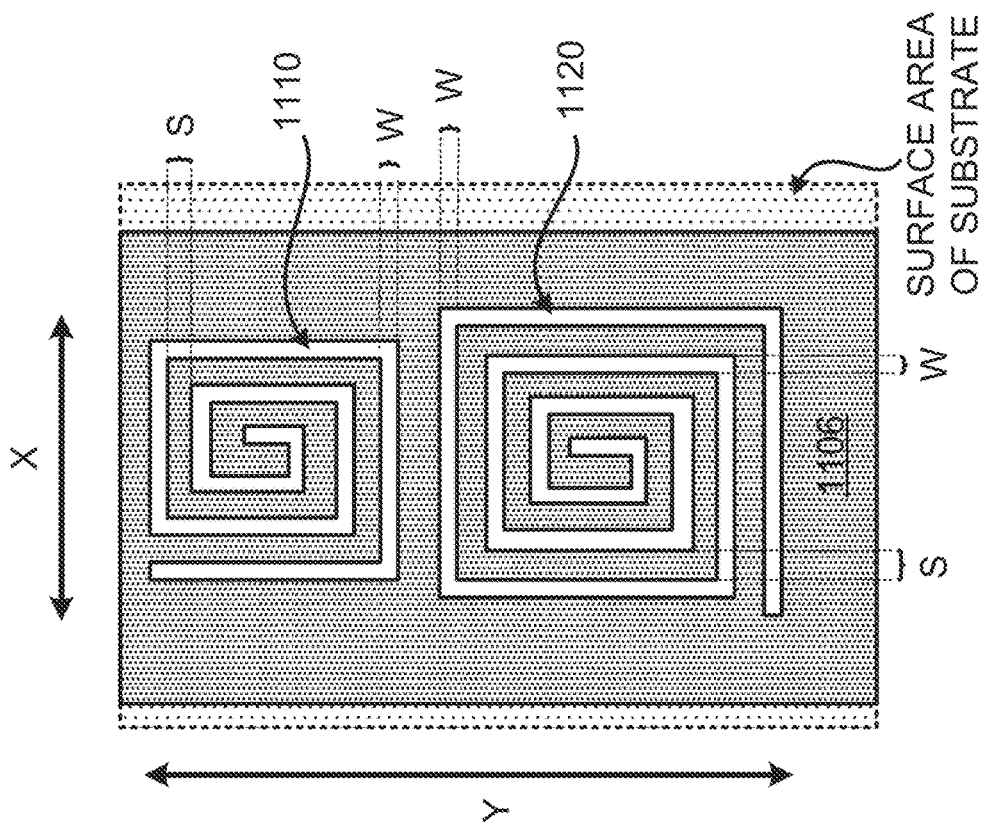
FIG. 11 illustrates a plan view of a patterned ground layer having slots with spiral shapes.

FIG. 11 illustrates a patterned ground layer 1106 that includes a slot 1110 and a slot 1120. The slot 1110 has a shape of a spiral. The slot 1120 has a shape of a spiral. The spiral of the slot 1120 is bigger than the spiral of the slot 1110. Similarly, the overall dimensions described in FIG. 9 may apply to the slots 1110 and 1120. The size and shape of the spirals are exemplary.

Figure 12:
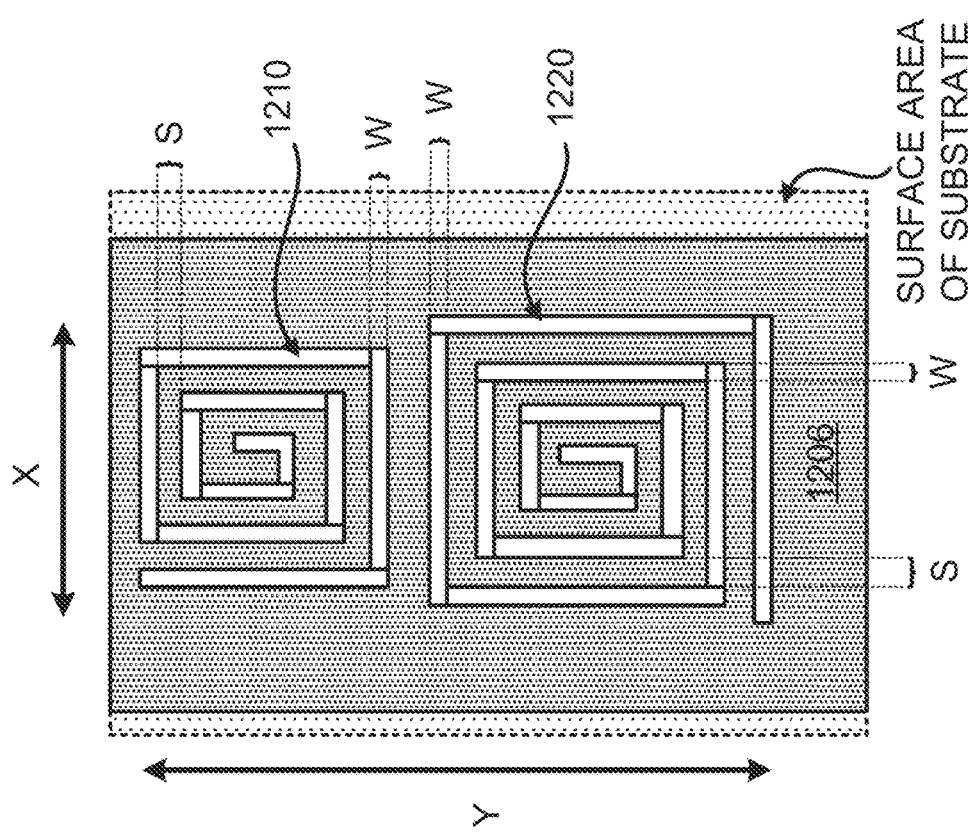
FIG. 12 illustrates a plan view of a patterned ground layer having slots with spiral shapes.

FIG. 12 illustrates a patterned ground layer 1106 that includes a first plurality of slots 1210 and a second plurality of slots 1120. The first plurality of slots 1210 has a shape of a spiral. The second plurality of slots 1220 has a shape of a spiral. FIG. 12 illustrates that the spiral shape may be defined be several slots instead of one single slot. The spiral of the plurality of slots 1220 is bigger than the spiral of the plurality of slots 1110. The overall dimensions described in FIG. 9 may apply to the plurality of slots 1210 and 1220. The size and shape of the spirals are exemplary.

It is noted that the 50% value described above is merely exemplary. Different implementations may provide slots with different coverage area. In some implementations, the slots, may collectively represent more or less than 50% of the surface area of the inductors. In some implementations, a coverage area of approximately 50% (e.g., 45% to 55%) of the surface area of one or more inductors may provide the proper amount of shielding and isolation, while also maximining inductance and Q value for the inductors. The term 'coverage area' may mean the area where the slots overlaps (e.g., vertically overlaps) with the inductors, when viewed from a plan view perspective. It is noted that the slots may be positioned over an area where there is no inductor beneath or above the slots. A coverage area of approximately 50% may mean that the slots vertically overlap with approximately 50% of the inductors, but the slots may represent more than 50% of the area of the metal layer on which the slots are formed. As mentioned above, the ground layers may provide EM shielding and/or isolation. In some implementations, the first patterned ground layer and the second patterned ground layer, of FIGS. 5-12, may individually or collectively, provide negative 60-85 decibels (dB) of isolation between the first inductor and the second inductor.

Having described a substrate that includes a ground layers, methods for fabricating the disclosed substrates will now be described below.

Exemplary Sequence for Fabricating a Coreless Substrate

In some implementations, fabricating a substrate includes several processes. FIG. 13 (which includes FIGS. 13A-13D) illustrates an exemplary sequence for providing or fabricating a substrate that includes a patterned ground layer. In some implementations, the sequence of FIGS. 13A-13D may be used to provide or fabricate the substrate 400 of FIG. 4.

It should be noted that the sequence of FIGS. 13A-13D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 13A:
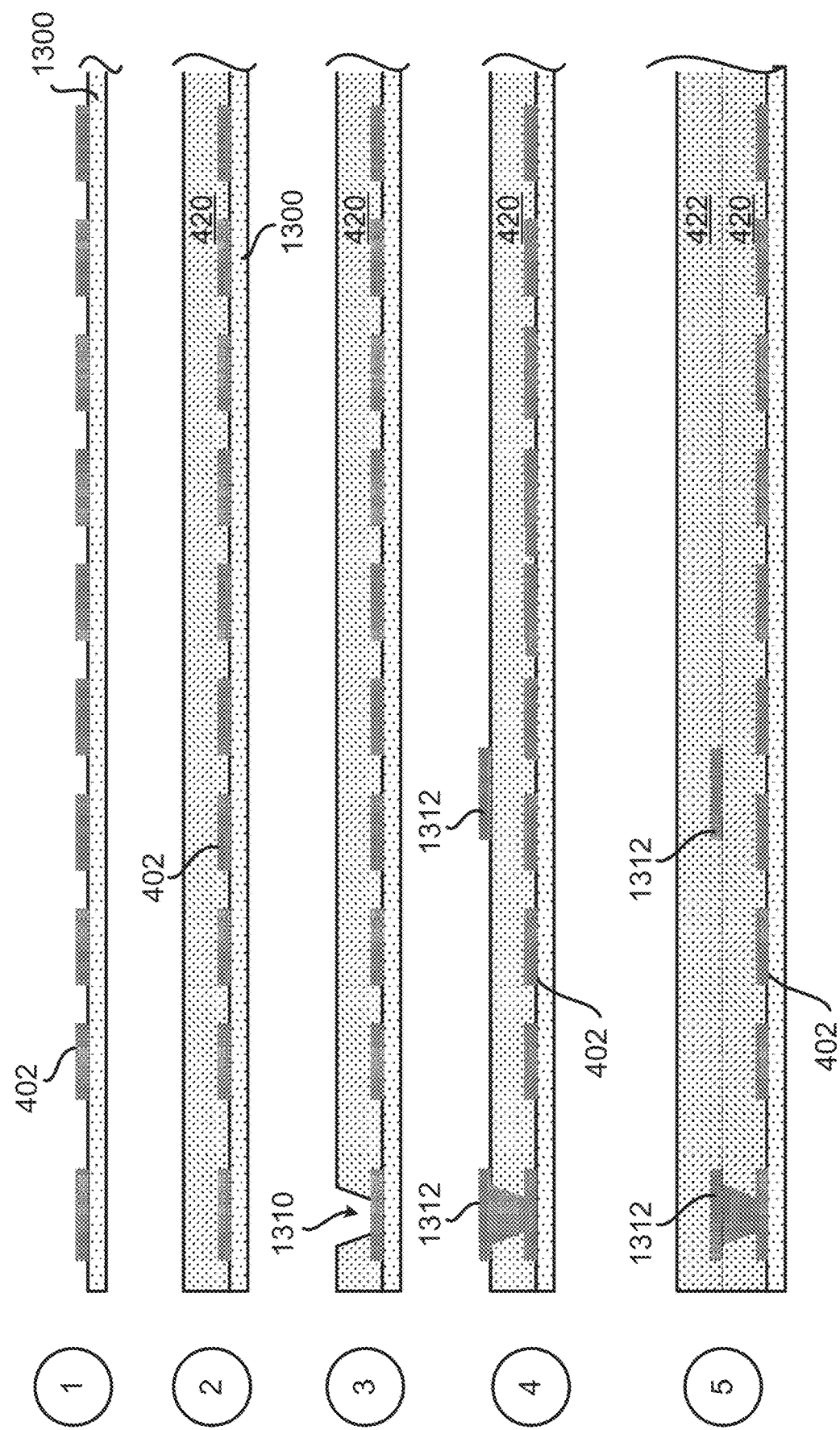
FIG. 13 (comprising FIGS. 13A-13D) illustrates an exemplary sequence for fabricating a substrate that includes inductors and patterned ground layers for shielding the inductors.

Stage 1, as shown in FIG. 13A, illustrates a state after a carrier 1300 is provided and a metal layer is formed over the carrier 1300. The metal layer may be patterned to form interconnects 402. A plating process may be used to form the metal layer and interconnects.

Stage 2 illustrates a state after a dielectric layer 420 is formed over the carrier 1300 and the interconnects. The dielectric layer 420 may include polyimide.

Stage 3 illustrates a state after a plurality of cavities 1310 is formed in the dielectric layer 420. The plurality of cavities 1310 may be formed using an etching process or laser process.

Stage 4 illustrates a state after interconnects 1312 are formed in and over the dielectric layer 420. For example, a via, pad and/or traces may be formed. A plating process may be used to form the interconnects.

Stage 5 illustrates a state after another dielectric layer 422 is formed over the dielectric layer 420.

Figure 13B:
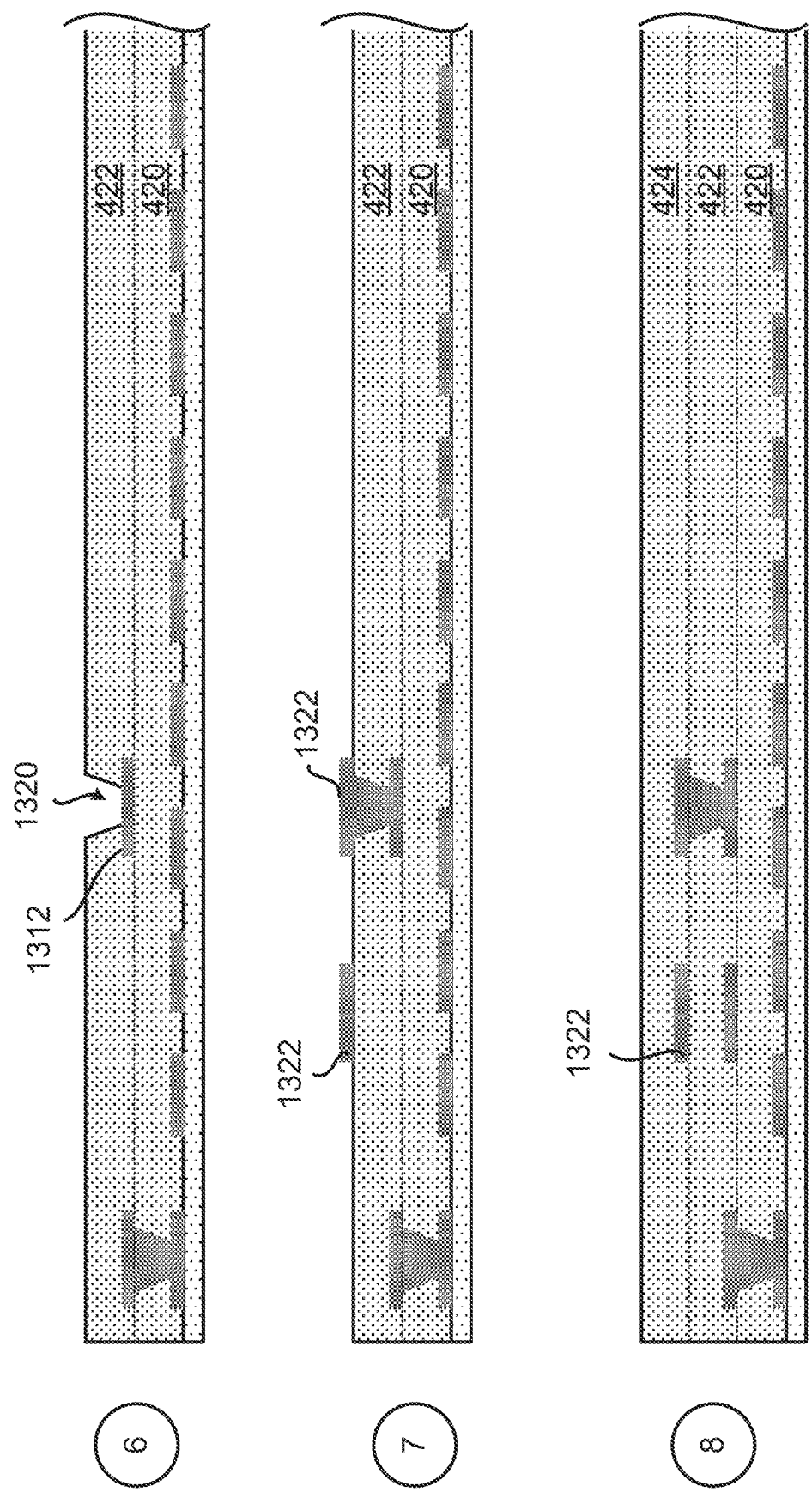

Stage 6, as shown in FIG. 13B, illustrates a state after a cavity 1320 is formed in the dielectric layer 422. An etching process or laser process may be used to form the cavities 1320.

Stage 7 illustrates a state after interconnects 1322 are formed in and over the dielectric layer 422. For example, via, pad and/or trace may be formed. A plating process may be used to form the interconnects.

Stage 8 illustrates a state after another dielectric layer 424 is formed over the dielectric layer 422.

Figure 13C:
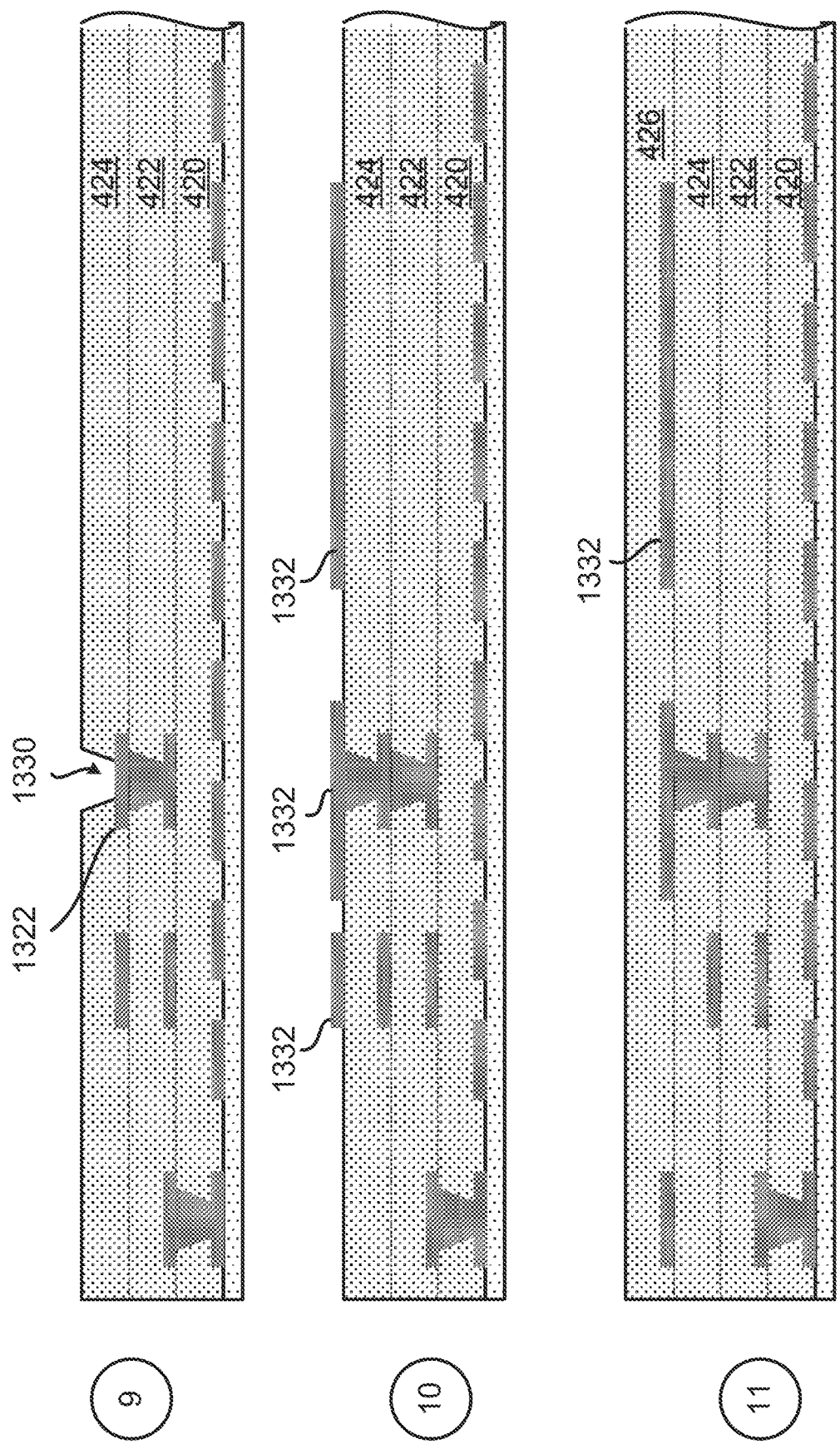
Figure 13D:
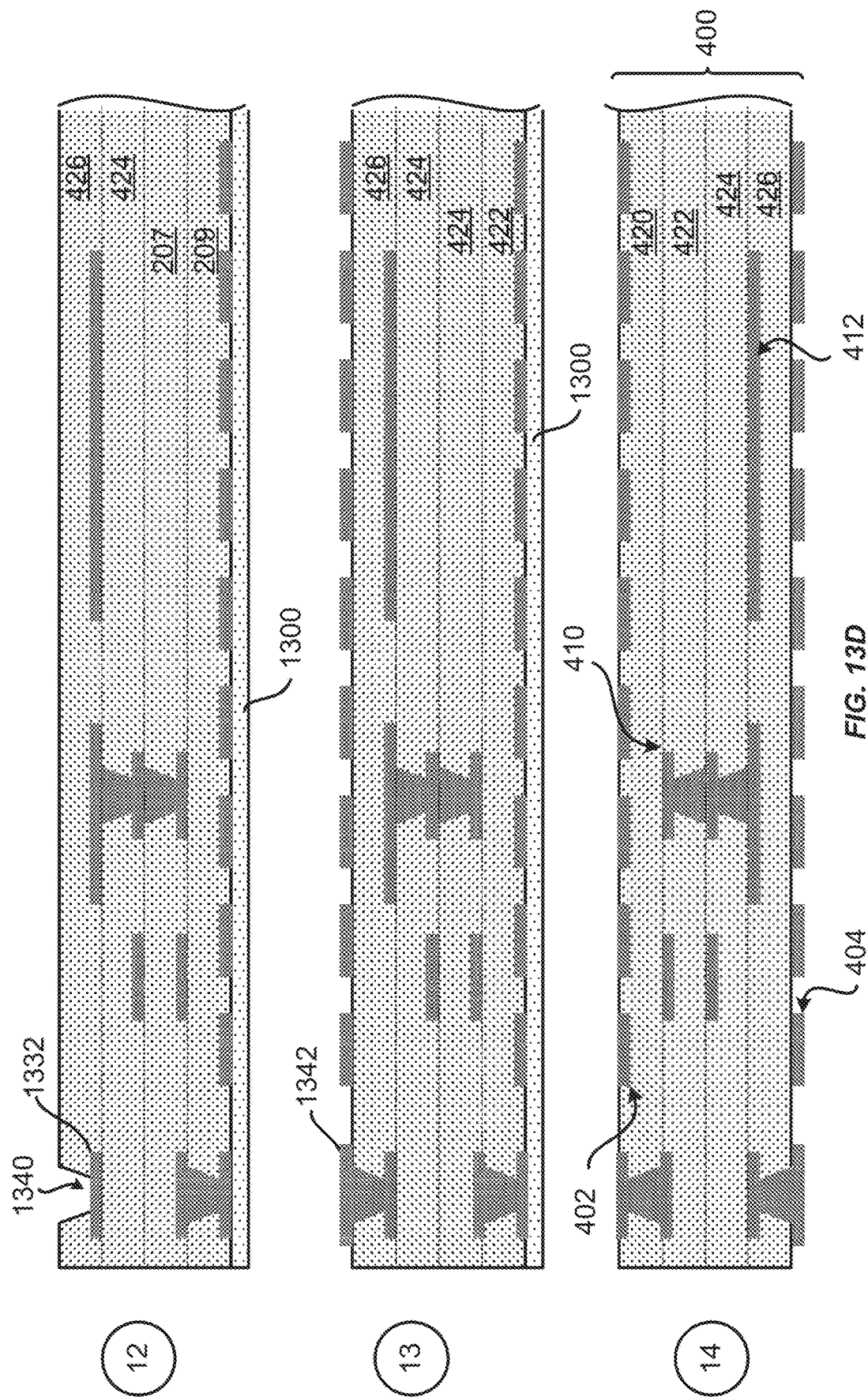

Stage 9, as shown in FIG. 13C, illustrates a state after a cavity 1330 is formed in the dielectric layer 424. An etching process or laser process may be used to form the cavities 1330.

Stage 10 illustrates a state after interconnects 1332 are formed in and over the dielectric layer 424. For example, via, pad and/or trace may be formed. A plating process may be used to form the interconnects.

Stage 11 illustrates a state after another dielectric layer 426 is formed over the dielectric layer 424.

Stage 12, as shown in FIG. 13C, illustrates a state after a cavity 1340 is formed in the dielectric layer 426. An etching process or laser process may be used to form the cavities 1340.

Stage 13 illustrates a state after interconnects 1342 are formed in and over the dielectric layer 426. For example, via, pad and/or trace may be formed. A plating process may be used to form the interconnects.

Stage 14 illustrates after the carrier 1300 is decoupled (e.g., removed, grinded out) from the dielectric layer 420, leaving the substrate 400 (e.g., coreless substrate). In some implementation, the coreless substrate is an embedded trace substrate (ETS). Stage 14 illustrates the substrate 400 that includes the dielectric layer 420, the dielectric layer 422, the dielectric layer 424 and the dielectric layer 426. In some implementations, the dielectric layer 420, the dielectric layer 422, the dielectric layer 424 and the dielectric layer 426 may be considered as one dielectric layer (e.g., single dielectric layer). The substrate 400 includes the plurality of interconnects 402, the plurality of interconnects 404 and the plurality of interconnects 406. The plurality of interconnects 406 may include the plurality of interconnects 410 and the plurality of interconnects 412.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 14:
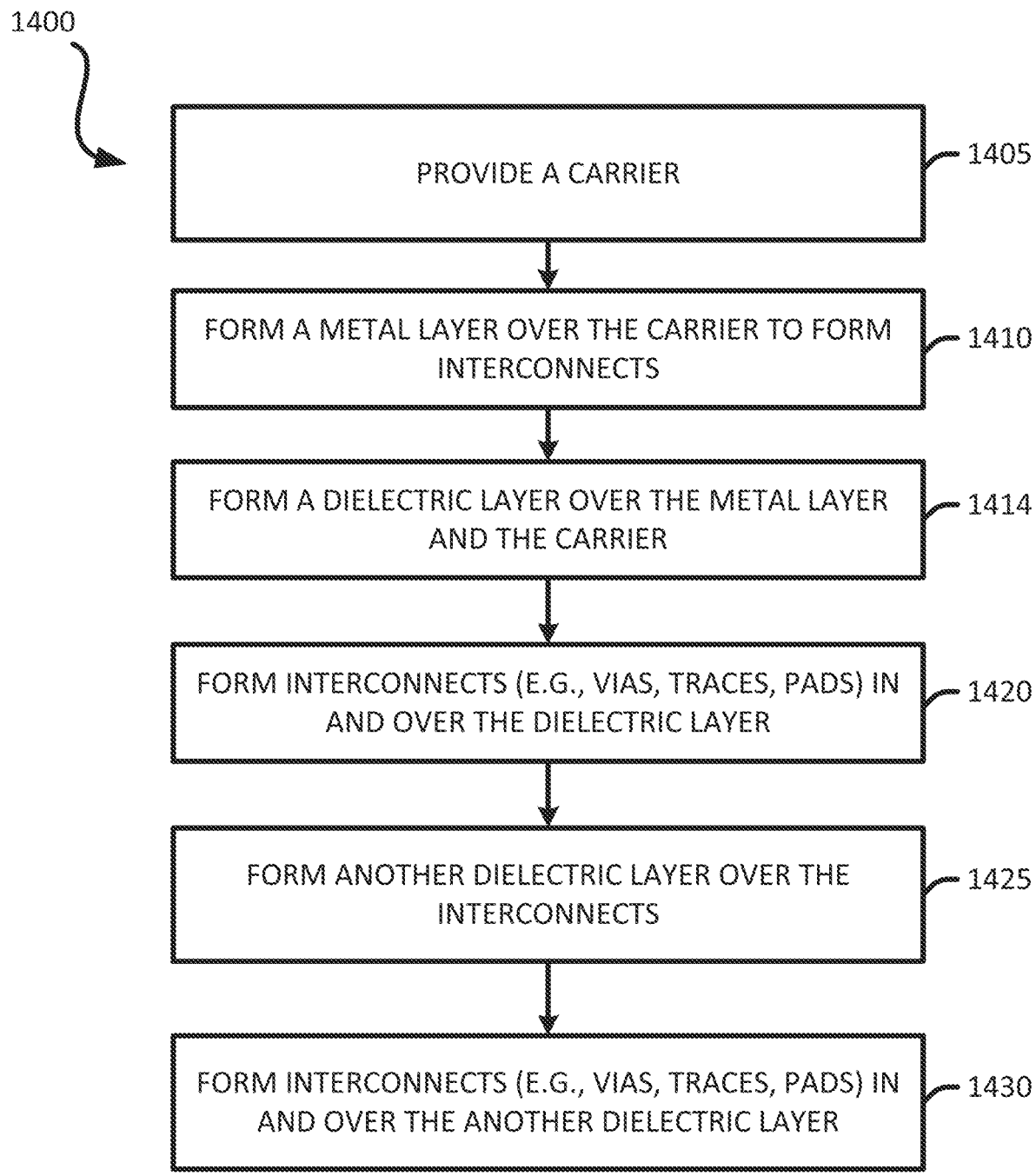
FIG. 14 illustrates an exemplary flow diagram of a method for fabricating a coreless substrate.

Exemplary Flow Diagram of a Method for Fabricating a Substrate with Patterned Ground Layer In some implementations, fabricating a substrate includes several processes. FIG. 14 illustrates an exemplary flow diagram of a method 1400 for providing or fabricating a substrate having a patterned ground layer. In some implementations, the method 1400 of FIG. 14 may be used to provide or fabricate the substrate of FIGS. 2 and/or 4. For example, the method of FIG. 14 may be used to fabricate the substrate 400.

It should be noted that the sequence of FIG. 14 may combine one or more processes in order to simplify and/or clarify the method for providing or fabricating a substrate. In some implementations, the order of the processes may be changed or modified.

The method provides (at 1405) a carrier 1300. The method forms (at 1410) a metal layer over the carrier 1300. The metal layer may be patterned to form interconnects. A plating process may be used to form the metal layer and interconnects.

The method forms (at 1415) a dielectric layer 420 over the carrier 1300 and the interconnects. The dielectric layer 420 may include polyimide. Forming the dielectric layer may also include forming a plurality of cavities (e.g., 1310) in the dielectric layer 420. The plurality of cavities may be formed using an etching process or laser process.

The method forms (at 1420) interconnects in and over the dielectric layer. For example, the interconnects 1312 may formed. A plating process may be used to form the interconnects. Forming interconnects may include providing a patterned metal layer over and/or in the dielectric layer.

The method forms (at 1425) a dielectric layer 422 over the dielectric layer 420 and the interconnects. The dielectric layer 422 may include polyimide. Forming the dielectric layer may also include forming a plurality of cavities (e.g., 1320) in the dielectric layer 422. The plurality of cavities may be formed using an etching process or laser process.

The method forms (at 1430) interconnects in and/or over the dielectric layer. For example, the interconnects 1322 may formed. A plating process may be used to form the interconnects. Forming interconnects may include providing a patterned metal layer over an in the dielectric layer.

The method may form additional dielectric layer(s) and additional interconnects as described at 1425 and 1430.

Once all the dielectric layer(s) and additional interconnects are formed, the method may decouple (e.g., remove, grind out) the carrier (e.g., 1300) from the dielectric layer 420, leaving the substrate. In some implementation, the coreless substrate is an embedded trace substrate (ETS).

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Electronic Devices

Figure 15:
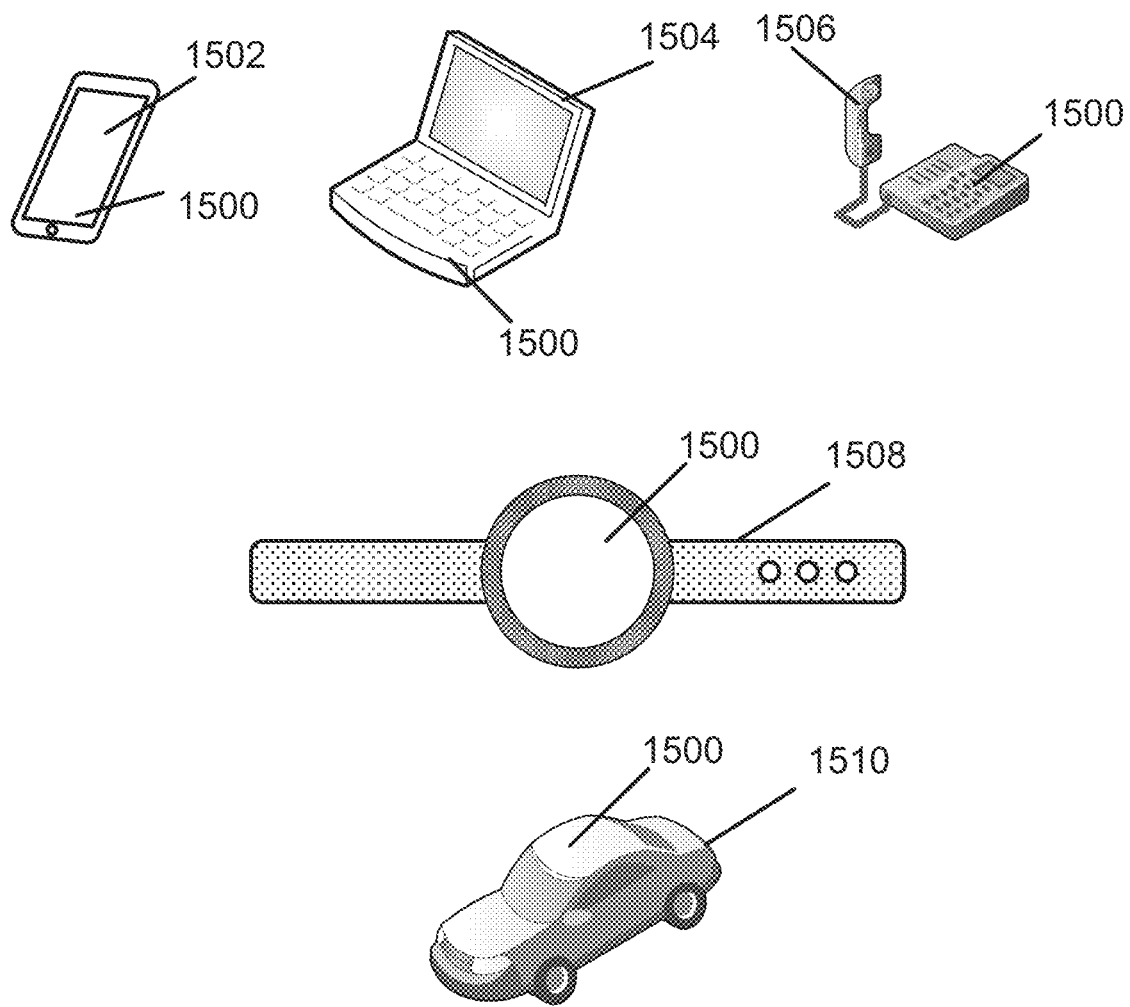
FIG. 15 illustrates various electronic devices that may integrate a die, an integrated device, an integrated passive device (IPD), a device package, a package, an integrated circuit, a substrate and/or a PCB described herein.

FIG. 15 illustrates various electronic devices that may be integrated with any of the aforementioned device, integrated device, integrated circuit (IC) package, integrated circuit (IC) device, semiconductor device, integrated circuit, die, interposer, package or package-on-package (PoP). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-12, 13A-13D, and/or 14-15 may be rearranged and/or combined into a single component, process, feature or function or embodied in several components, processes, or functions. Additional elements, components, processes, and/or functions may also be added without departing from the disclosure. It should also be noted FIGS. 2-12, 13A-13D, and/or 14-15 and its corresponding description in the present disclosure is not limited to dies and/or ICs. In some implementations, FIGS. 2-12, 13A-13D, and/or 14-15 and its corresponding description may be used to manufacture, create, provide, and/or produce devices and/or integrated devices. In some implementations, a device may include a die, a substrate, an integrated device, an integrated passive device (IPD), a die package, an integrated circuit (IC) device, a device package, an integrated circuit (IC) package, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately", as used in the disclosure shall mean within 10 percent of the 'value X'. For example, a value of about 1 or approximately 1, would mean a value in a range of 0.9-1.1.

In some implementations, an interconnect is an element or component of a device that allows or facilitates an electrical connection between two points, elements and/or components. In some implementations, an interconnect may include a trace, a via, a pad, a pillar, a metal layer (e.g., a redistribution metal layer), and/or an under bump metallization (UBM) layer. In some implementations, an interconnect is an electrically conductive material that may be configured to provide an electrical path for a signal (e.g., a data signal, ground or power). An interconnect may be part of a circuit. An interconnect may include more than one element or component.

In some implementations, the height of the device and/or package may be defined along the Z-direction of the package, which is shown in the figures of the present disclosure. In some implementations, the Z-direction of the device and/or package may be defined along an axis between a top portion and a bottom portion of the device and/or package. The terms top and bottom may be arbitrarily assigned, however as an example, the top portion of the device and/or package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion.

The X-Y directions or the X-Y plane of the device and/or package may refer to the lateral direction and/or footprint of the device and/or package. Examples of X-Y directions are shown in the figures of the present disclosure. The width, length and/or diameter of an object may refer to dimension(s) along the X-Y dimensions and/or the X-Y plane. In many of the figures of the present disclosure, the devices and/or packages and their respective components are shown across a X-Z cross-section or X-Z plane. However, in some implementations, the packages and their representative components may be represented across a Y-Z cross-section or Y-Z plane.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
   a substrate comprising:
      a plurality of metal layers including a first metal layer and a second metal layer, the first metal layer including patterns that form a first patterned ground layer that includes a plurality of slots, wherein the plurality of slots is arranged in a row of slots;
      at least one dielectric layer;
      a first inductor formed in the at least one dielectric layer; and
      a second inductor formed in the at least one dielectric layer,
      wherein the first patterned ground layer is configured to provide electromagnetic (EM) shielding, and
      wherein the first inductor and the second are between the first patterned ground layer and the second metal layer.

2. The apparatus of claim 1,
   wherein each slot includes a length and a width,
   wherein the first inductor includes a first dimension and a second dimension, and
   wherein the length of each slot is at most 50 percent of the first dimension of the first inductor.

3. The apparatus of claim 2,
   wherein the plurality of slots is filled with the at least one dielectric layer, and
   wherein a cumulative width of the rows of slots is at most 50 percent of the second dimension of the first inductor.

4. The apparatus of claim 1, wherein the plurality of slots includes a slot with a rectangular shape, a slot with a polygon shape, a slot with a circular shape, or combinations thereof.

5. The apparatus of claim 1, wherein the first patterned ground layer includes at least one slot that, individually or collectively, has a shape of a spiral.

6. The apparatus of claim 1, wherein the patterned ground layer provides at least negative 60 decibels (dB) of isolation between the first inductor and the second inductor.

7. The apparatus of claim 1, the second metal layer including patterns that form a second patterned ground layer, wherein the first inductor and the second inductor are between the first patterned ground layer and the second patterned ground layer.

8. The apparatus of claim 7, wherein the first patterned ground layer and the second patterned ground layer collectively provide negative 60-85 decibels (dB) of isolation between the first inductor and the second inductor.

9. The apparatus of claim 1, wherein the first patterned ground layer is coupled to ground.

10. The apparatus of claim 1, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. A apparatus comprising:
a substrate comprising,
  a plurality of metal layers including a first metal layer and a second metal layer, the first metal layer including patterns that form means for first electromagnetic (EM) shielding that includes a plurality of slots;
  at least one dielectric layer;
  means for first inductance formed in the at least one dielectric layer, wherein the means for first inductance is configured to generate a first electromagnetic field having a first wavelength; and
  means for second inductance formed in the at least one dielectric layer,
  wherein each slot from the plurality of slots includes a width that is at least 1/50 of the first wavelength of the first electromagnetic field that is generated by the means for first inductance, and
  wherein the means for first inductance and the means for second inductance are between the means for first EM shielding and the second metal layer.

12. The apparatus of claim 11,
wherein the means for second inductance is configured to generate a second electromagnetic field having a second wavelength, and
wherein each slot from the plurality of slots includes a width that is at least 1/50 of the first wavelength of the first electromagnetic field that is generated by the means for first inductance.

13. The apparatus of claim 11,
wherein the plurality of slots is filled with the at least one dielectric layer, and
wherein a spacing between two adjacent slots from the plurality of slots includes a minimum width that is at least 1/50 of the first wavelength of the first electromagnetic field that is generated by the means for first inductance,
wherein the plurality of slots vertically overlaps with at most, 55 percent of the means for first inductance.

14. The apparatus of claim 11, wherein the plurality of slots includes a slot with a rectangular shape, a slot with a polygon shape, a slot with a circular shape, or combinations thereof.

15. The apparatus of claim 11, wherein the means for first EM shielding includes at least one slot that, individually or collectively, has a shape of a spiral.

16. The apparatus of claim 11, wherein the means for first EM shielding provides at least negative 60 decibels (dB) of isolation between the first inductor and the second inductor.

17. The apparatus of claim 11, wherein the second metal layer includes patterns that form means for second EM shielding, wherein the means for first inductance and the means for second inductance are between the means for second EM shielding and the means for second EM shielding.

18. The apparatus of claim 17, wherein the means for first EM shielding and the means for second EM shielding collectively provide negative 60-85 decibels (dB) of isolation between the means for first inductance and the means for second inductance.

19. The apparatus of claim 11, wherein the means for first EM shielding is coupled to ground.

20. The apparatus of claim 11, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. A method for fabricating a substrate, comprising:
forming a plurality of metal layers including a first metal layer and a second metal layer;
forming at least one dielectric layer;
  forming a first inductor in the at least one dielectric layer, wherein the first inductor is configured to generated an electromagnetic field having a wavelength;
forming a second inductor in the at least one dielectric layer; and
patterning the first metal layer so that the first metal layer includes a first patterned ground layer that includes a plurality of slots,
  wherein each slot from the plurality of slots includes a minimum width that is at least 1/50 of the wavelength of the electromagnetic field that is generated by the first inductor,
  wherein the first patterned ground layer is configured to provide electromagnetic (EM) shielding, and
  wherein forming the first inductor and the second inductor include forming the first inductor and the second inductor between the first patterned ground layer the second metal layer.

22. The method of claim 21, wherein a spacing between two slots from the plurality of slots includes a minimum width that is at least 1/50 of the wavelength of the electromagnetic field that is generated by the first inductor.

23. The method of claim 21, wherein the plurality of slots is filled with the at least one dielectric layer.

24. The method of claim 21, wherein the plurality of slots includes a slot with a rectangular shape, a slot with a polygon shape, a slot with a circular shape, or combinations thereof.

25. The method of claim 21, wherein forming the first patterned ground layer includes forming the first patterned ground layer with at least one slot that, individually or collectively, has a shape of a spiral.

* * * * *